(12) United States Patent
Murayama et al.

(10) Patent No.: US 6,184,965 B1
(45) Date of Patent: Feb. 6, 2001

(54) CIRCUIT CONNECTION STRUCTURE

(75) Inventors: Kazuhiko Murayama, Atsugi; Atsushi Mizutome, Kanagawa-ken, both of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 08/822,704

(22) Filed: Mar. 21, 1997

(30) Foreign Application Priority Data

Mar. 26, 1996 (JP) .................................................. 8-070493
May 14, 1996 (JP) .................................................. 8-119394

(51) Int. Cl.$^7$ ..................................................... G02F 1/133
(52) U.S. Cl. .............................................................. 349/150
(58) Field of Search ..................................... 349/149, 110, 349/150, 151, 152; 257/662, 672; 361/749, 783, 789

(56) References Cited

U.S. PATENT DOCUMENTS

| | | | |
|---|---|---|---|
| 5,130,832 | * 7/1992 | Kawaguchi et al. | 349/151 |
| 5,146,354 | * 9/1992 | Plesinger | 349/58 |
| 5,283,677 | * 2/1994 | Sagawa et al. | 349/150 |
| 5,680,191 | * 10/1997 | Voisin et al. | 349/150 |
| 5,745,202 | * 4/1998 | Yamauchi et al. | 349/110 |

* cited by examiner

*Primary Examiner*—Kenneth Parker
*Assistant Examiner*—Tai V. Duong
(74) *Attorney, Agent, or Firm*—Fitzpatrick, Cella, Harper & Scinto (57) ABSTRACT

A tape carrier package structure suitable for constituting a display apparatus, includes: a flexible film, a semiconductor device mounted on the film, a first conductor pattern formed on the film and connected to the semiconductor device for inputting signals to and/or outputting signals from the semiconductor device, and a second conductor pattern formed in a region not provided with the first conductor pattern on the film in a state substantially free from signal supply to or from the semiconductor device. The second conductor pattern may be connected to a circuit board for supplying an electric power and control signals to the semiconductor device. The second conductor pattern promotes a heat dissipation from the tape carrier package and the semiconductor device mounted thereon.

16 Claims, 6 Drawing Sheets

CIRCUIT CONNECTION STRUCTURE

FIELD OF THE INVENTION AND RELATED ART

The present invention relates to an integrated circuit connection structure, and particularly to a tape carrier package (TCP) carrying an integrated circuit with an improved heat dissipation characteristic.

The tape-automated bonding (TAB) scheme using a tape carrier package (TCP) as a scheme of mounting an integrated circuit or integrated circuits on a substrate is being widely used for mounting ICs for thin electronic calculators and driver ICs for driving liquid crystal displays (LCDs), as representative examples. Recently, the TAB scheme has also been used for mounting of central processing units (CPUs).

Integrated circuit mounting structures including a driver IC mounted on a substrate may, for example, include a TCP loaded with an IC connected to a substrate for a power supply, etc.

Incidentally, for production of LCDs which have been enlarged in area and required to effect higher resolution display in recent years, it has been required to comply with increases in number and length of drive lines (scanning lines and data lines) on a display panel for LCDs, higher performances and an increase in the number of output electrodes (pins) for driver ICs as integrated circuits for LCDs, and narrower pitches of input and output lead patterns (conductor patterns) on TCPs. Along with such increases in drive performances and the number of output pins of driver ICs, an increased amount of heat is evolved during operation of a driver IC due to an increased drive load on the driver IC.

When such an increased amount of heat is evolved from driver ICs in an LCD, the evolved heat from the drive ICs is conducted to the liquid crystal panel via the TCP to generate a temperature distribution along the liquid crystal panel. As a result, a difference in picture display performance over the panel occurs.

In LCD designing at present, temperature distribution over a display panel has been made uniform by optimized disposition of surrounding units, such as a backlight, a driver controller, a power supply unit, etc. However, when a substantial amount of heat is conducted to the display panel from driver ICs disposed in proximity to the panel, it becomes difficult to realize a sufficiently uniform temperature distribution by such conventional optimized disposition of surrounding units. It is also difficult to achieve it by disposition of a heat radiation plate or a heat slinger.

On the other hand, a mounting technique using a TCP not only is used for mounting LCD driver ICs but also is gradually used for mounting general-purpose integrated circuits. Accordingly, even for a TCP mounted with a CPU, the heat evolution from an integrated circuit is becoming problematic along with the use of higher speed clock signals and narrower conductors for the integrated circuit. Incidentally, in the case of a known package structure, such as a quad flat package (QFP), it is possible to attach a heat radiating plate, but the attachment is difficult for a TCP in view of its structure.

SUMMARY OF THE INVENTION

In view of the above-mentioned problems, a principal object of the present invention is to provide an integrated circuit connection structure capable of effectively dissipating heat evolved in an integrated circuit and a tape carrier package.

According to the present invention, there is provided a tape carrier package structure, comprising:

a flexible film, a semiconductor device mounted on the film, a first conductor pattern formed on the film and connected to the semiconductor device for inputting signals to and/or outputting signals from the semiconductor device, and a second conductor pattern formed in a region not provided with the first conductor pattern on the film in a state substantially free from signal supply to or from the semiconductor device.

According to another aspect of the present invention, there is provided a tape carrier package structure having two major surfaces, comprising:

a flexible film, a semiconductor device mounted on the film, and a first conductor pattern formed on the film and connected to the semiconductor device for inputting signals to and/or outputting signals from the semiconductor device, wherein at least a portion of at least one of the two major surfaces has been subjected to blackening.

These and other objects, features and advantages of the present invention will become more apparent upon consideration of the following description of the preferred embodiments of the present invention taken in conjunction with the accompanying drawings, wherein like parts are denoted by like reference numerals.

DESCRIPTION OF THE PREFERRED EMBODIMENTS

The TCP structure according to the first aspect of the present invention includes a flexible film, a semiconductor device mounted thereon and a first conductor pattern formed on the film and connected to the semiconductor device for signal supply from and/or to the semiconductor device. In addition to the first conductor pattern, the TCP structure further includes a second conductor pattern (dummy conductor pattern) substantially free from charge of signal supply to or from the semiconductor device, e.g., substantially free from contact with the input electrodes or the output electrodes of the semiconductor device in charge of signal input or output from the semiconductor device.

The TCP structure is mounted on another substrate (or a circuit board) for supplying an electric power and signals to the semiconductor device or another substrate (e.g., a display panel) for receiving signals from the semiconductor device, respectively via the first conductor pattern, to form a circuit connection structure. During the operation of the semiconductor device, heat is evolved from the semiconductor device and/or the first conductor pattern, and the heat may be effectively dissipated via the second conductor pattern.

The second conductor pattern may preferably be formed to have a large surface area within a possible extent, e.g., formed in a non-divided (solid) conductor pattern (in an island form) or in conductor stripes having a width larger than electrodes of the first conductor pattern. The second conductor pattern may preferably be formed of a material having a large thermal conductivity, e.g., copper, so as to exhibit good heat dissipation performance. The second conductor pattern may preferably be connected to the circuit board to utilize the circuit board as a heat slinger, thereby realizing effective heat dissipation. If the second conductor pattern is connected (thermally and sometimes further electrically within an extent of not obstructing the function of the semiconductor device) to the semiconductor device at parts other than the input and output electrodes of the semiconductor device, the heat dissipation from the semiconductor device is further promoted.

The TCP structure may be particularly suitably applied to mounting of driver ICs for a display apparatus. More particularly, the semiconductor device in the TCP structure may be used as a driver IC, the output electrodes of the semiconductor device may be connected to electrode terminals on a substrate of a display panel via a first conductor pattern, and the input electrodes of the semiconductor device may be connected via another first conductor pattern to a circuit board for supplying an electric power and signals to the display panel via the semiconductor device. The second conductor pattern formed on the flexible film may preferably be connected (thermally and electrically) to at least the circuit board so as to conduct heat evolved from the driver IC and the first conductor pattern through which an electric power and signals are actually transmitted not to the conductor pattern side but to the circuit board for heat dissipation. As a result, a good picture display may be achieved even when a high-speed drive of a display panel has a temperature-dependence of display characteristic, while minimizing a temperature distribution over the display panel.

Hereinbelow, a more detailed description of the present invention will be made based on specific embodiments while referring to the drawings.

Figure 1:
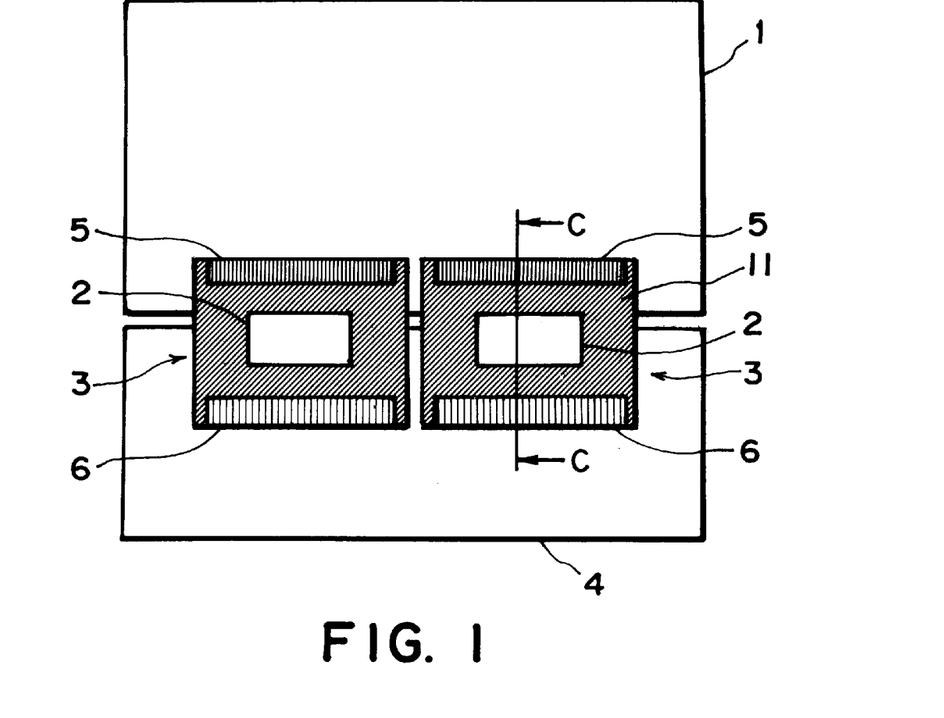
FIG. 1 is a top plan view of a display apparatus on which TCP structures are mounted.
Figure 2:
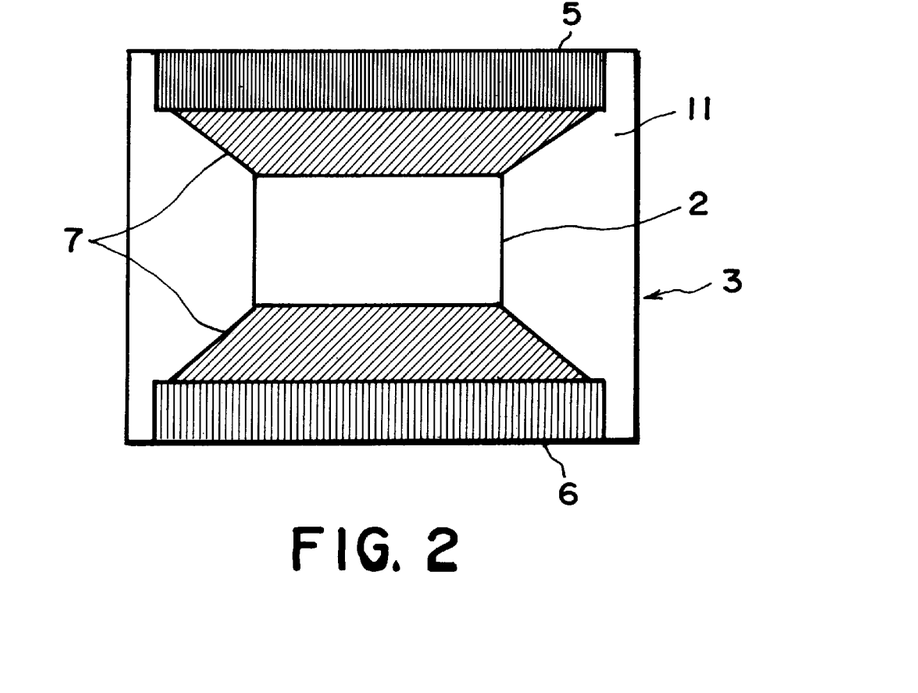
FIG. 2 is a bottom plan view of a TCP structure.

FIG. 1 is a plan view of a display apparatus including a driver circuit formed by mounting ordinary TCP structures carrying driver ICs on a substrate. Referring to FIG. 1, the display apparatus includes a display panel (e.g., a liquid crystal panel) 1, TCPs 3 each including a film 11 and a driver IC 2 (as a semiconductor device) mounted on the film 11, a bus substrate 4 (circuit board) for supplying an electric power and signals to the driver ICs 2, output lead electrodes 5 for supplying drive voltage waveforms from the driver ICs 2 to the display panel 1, and input lead electrodes 6 for supplying an electric power and control signals from the bus substrate 4 to the driver ICs 2. Shown in FIG. 2 is a bottom plan view (a plan view as viewed from a back side in a state of removing a backside insulating protective film (actually present as described hereinbelow)) of a TCP 3 shown in FIG. 1 for illustrating a planar arrangement of a conductor pattern and a driver IC formed thereon. More specifically, a TCP 3 has, on the back surface of a film 11, lead patterns 7 each including a plurality of lead electrodes (not separately shown), output lead electrodes 5 (not separately shown) and input lead electrodes 6 (not separately shown). A driver IC 2 is mounted at the central part of the TCP 3, and a portion directly below the TCP 3 of the film 11 has been removed so that the driver IC 2 is exposed therethrough to the back surface of the TCP 3. The input electrodes and output electrodes (not shown) of the driver IC are connected to the input side and the output side, respectively, of the lead electrodes 7. The film 11 has been removed at portions corresponding to the output lead electrodes, the input electrodes and directly below the driver IC 2. The back side of the TCP 3 is coated with an insulating protective film (not shown) except for at least the portions corresponding to the output lead electrodes 5 and the input lead electrodes 6 so as to expose and allow the lead electrodes 5 and 6 to be connected to electrode terminals of the display panel 1 and the bus substrate 4.

In the structure shown in FIG. 1, along a peripheral side of the display panel 1, electrode terminals leading to the respective pixels in the display panel are formed, and the electrode terminals on the display panel are connected to the output lead electrodes 5 of the driver ICs via an anisotropic conductive adhesive or film (ACF, not shown), and the input lead electrodes 6 of the driver IC are connected to electrode terminals of the bus substrate 4 by soldering. By mounting the driver ICs 5 on the bus substrate 4 via the TCP 3 in the above-described manner, electric power and control signals are supplied to the driver ICs 2 from a controller (not shown) via the bus substrate 4 and the input lead electrodes 6.

Each driver IC 2 determines drive voltage waveform for driving the display panel 1 based on signal data inputted thereto and outputs the drive voltage waveform to the display panel 1. The display panel 1 receiving the drive voltage waveform inputted from the driver IC 2 effects a picture display. For example, in a liquid crystal display panel, the transmittance through a liquid crystal layer is changed at respective pixels, thus selectively turning on or off the pixels, to display a picture on the panel.

Figure 3:
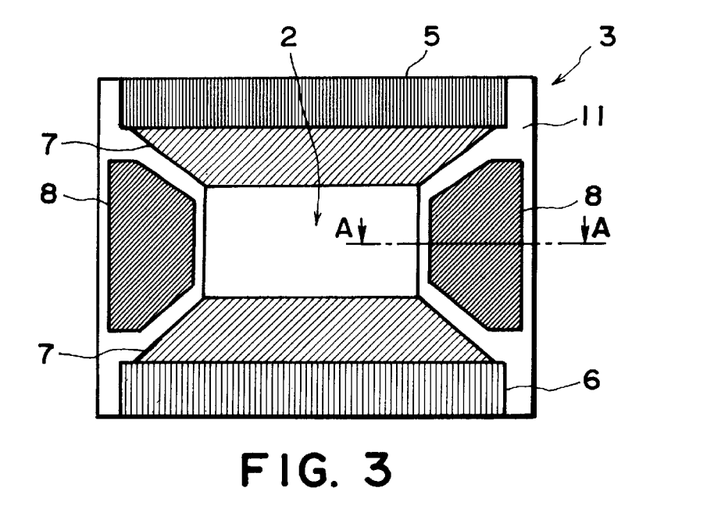
FIG. 3 is a bottom plan view of an embodiment of the TCP structure according to the invention.
Figure 4:
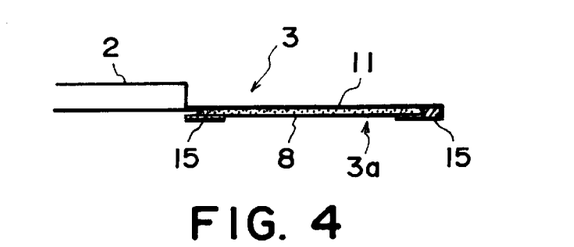
FIG. 4 is a sectional view taken along line A—A shown in FIG. 3.

FIG. 3 is a bottom plan view corresponding to FIG. 2 of a first embodiment of the TCP structure according to the present invention and FIG. 4 is a partial sectional view of the TCP structure taken along a line A—A as viewed in the directions (after overturning) in FIG. 3. In FIGS. 3 and 4, identical parts are denoted by identical reference numerals as in FIGS. 1 and 2.

Referring to FIGS. 3 and 4, a TCP 3 includes a conductor pattern 8 formed on a marginal or blank portion on the back side of a flexible film 11 where a first conductor pattern including a pattern of lead electrodes 7, output lead electrodes 5 and input lead electrodes 6 in charge of supplying an electric lower and control signals from or to the driver IC 2 is not formed. The conductor pattern 8 is a second conductor pattern in charge of heat dissipation. Each conductor pattern 8 is formed as a non-divided (or island-shaped) metal pattern but can be formed as stripe conductors having a width which is larger than that of the conductors constituting the lead electrodes 7, the output lead electrodes 5 and the input lead electrodes 6. Portions of the film 11 are removed at least at a part directly below the driver IC and parts corresponding to the output lead electrodes 5 and the input lead electrodes 6.

The back surface of the TCP 3 is coated with an insulating film (15 in FIG. 4) except for regions corresponding to the output lead electrodes 5 and the input lead electrodes 6 and possibly also the second conductor pattern 8, so that at least the output electrodes 5 and the input electrodes 6 are exposed to the back surface of the TCP 3 so as to allow connection to the electrode terminals of the display panel 1 and the bus substrate 4 as shown in FIG. 1.

Figure 5:
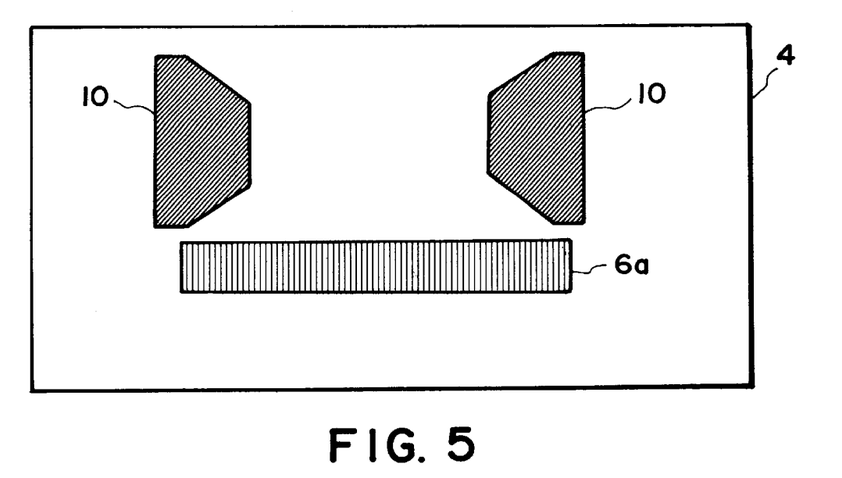
FIG. 5 is a top plan view of a substrate structure to which a TCP structure according to the invention may be connected.

On the back side of the TCP 3, the second conductor pattern 8 may preferably be further exposed at its portion 3a. When the TCP 3 is connected to the bus substrate 4 as shown in FIG. 1, the conductor pattern 8 may preferably be connected with its exposed portion 3a to a land (solid or island-shaped conductor pattern) 10 for heat dissipation formed on the bus substrate as shown in FIG. 5. In this embodiment, the conductor pattern 8 is disposed in symmetry on both of the opposite sides outside the driver IC as shown in FIG. 3, but this is not essential. Referring to FIG. 5, the bus substrate 4 is provided with electrode terminals 6a for connection with the input lead electrodes 6 of the TCP 3.

When the TCP 3 is connected to the bus substrate 4, if the second conductor pattern 8 is connected with the conductor land 10 for heat dissipation on the bus substrate 4, not only heat evolved at the TCP 3 but also heat evolved from the driver IC 2 can be easily conducted to the bus substrate 4 via the input lead electrodes 6 and the conductor pattern 8.

When the heat evolved from the TCP 3 and the driver IC 2 is conducted to the bus substrate 4 disposed on the input side of the driver IC 2, a temperature increase at the bus substrate 4 per se which is utilized as a kind of heat slinger may be expected, but the substrate 4 has a large heat capacity, so that a remarkable temperature increase at the driver IC can be effectively prevented. As a result, a remarkable heat evolution on an output side (e.g., a panel side) of the driver IC 2 can be alleviated, thus alleviating the occurrence of a deleterious temperature distribution over the display panel.

The first conductor pattern (including the lead electrodes 7, the output lead electrodes 5 and the input lead electrodes 6) and the second conductor pattern 8 on the TCP 3 may for example comprise copper foil plated with, e.g., tin, solder, Ni or gold. The film 11 may for example comprise polyimide or PET (polyethylene terephthalate).

Figure 6:
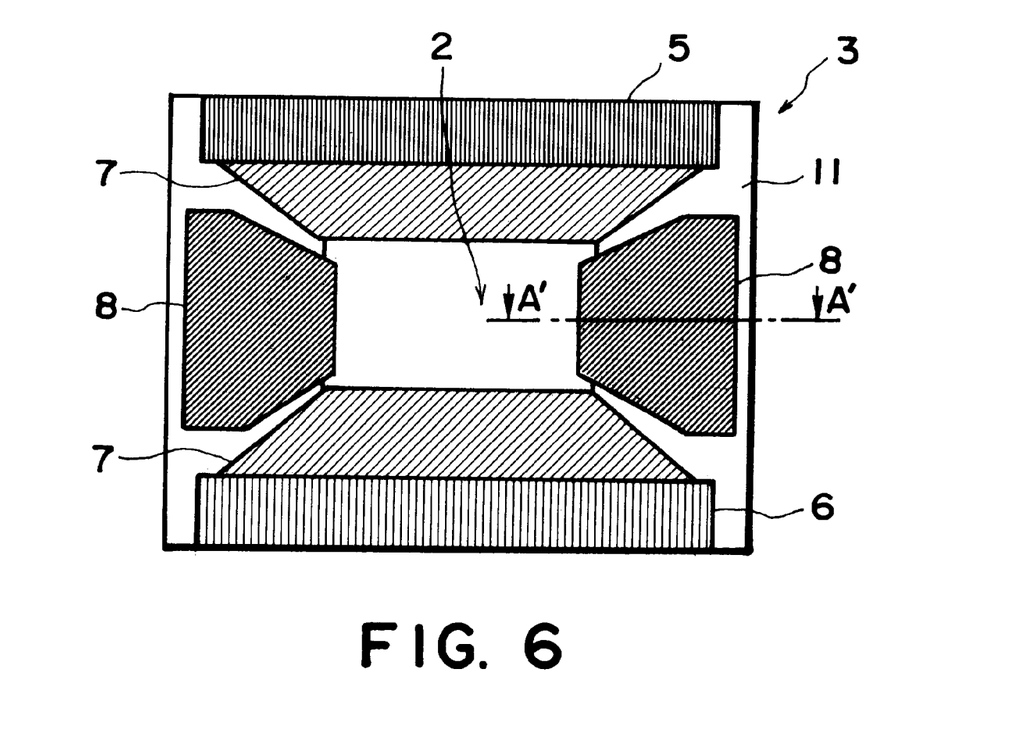
FIG. 6 is a bottom plan view of another embodiment of the TCP structure according to the invention.
Figure 7:
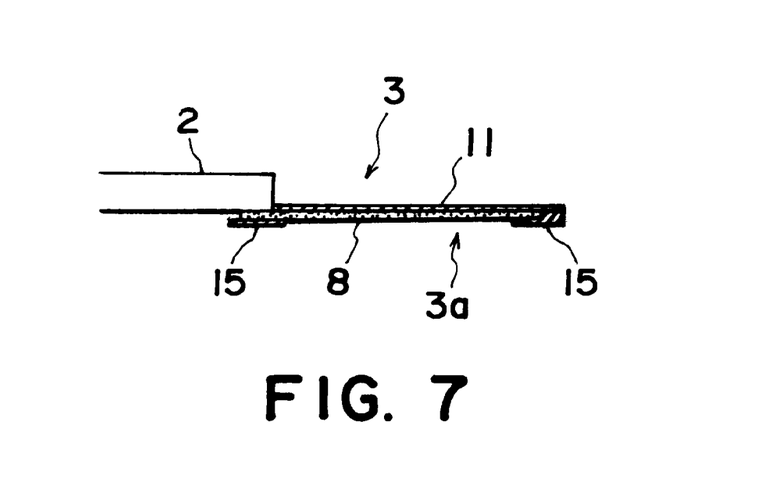
FIG. 7 is a sectional view taken along line A'—A' in FIG. 6.

FIG. 6 (a bottom plan view) and FIG. 7 (a sectional view taken along an line A'—A' in FIG. 6) illustrate a second embodiment of the TCP structure according to the present invention. A TCP 3 in this embodiment is different from the first embodiment shown in FIGS. 3 and 4 in that second conductor patterns 8 formed at a marginal portion on the film 11 are connected to the back side of a driver IC 2 (preferably at edges not in charge of signal output or input thereof). As a result of the connection of the conductor pattern 8 with the driver IC 2, heat evolved from the driver IC 2 may be dissipated through the conductor pattern 8 or preferably conducted to the bus substrate 4 in a manner as described with reference to FIG. 5. Particularly, in the latter case, the thermal connection between the driver IC 2 and the bus substrate 4 is enhanced to provide a further improved heat diffusion or dissipation effect.

Incidentally, the driver IC 2 may be provided with a power supply circuit including particularly a power supply line and a ground line for providing a reference potential which may be formed in larger width than other signal lines in some cases. In such a case, if the second conductor pattern 8 is thermally and electrically connected with the power supply line and the ground line, the heat dissipation may be further effectively performed.

In the above-described embodiments of TCPs shown in FIGS. 3 and 6, the second conductor pattern 8 is formed in a single layer but a similar conductor pattern layer may be additionally formed in superposition for promoting the heat dissipation from the driver IC 2 and the TCP 3 by such two layers of conductor pattern.

Figure 8:
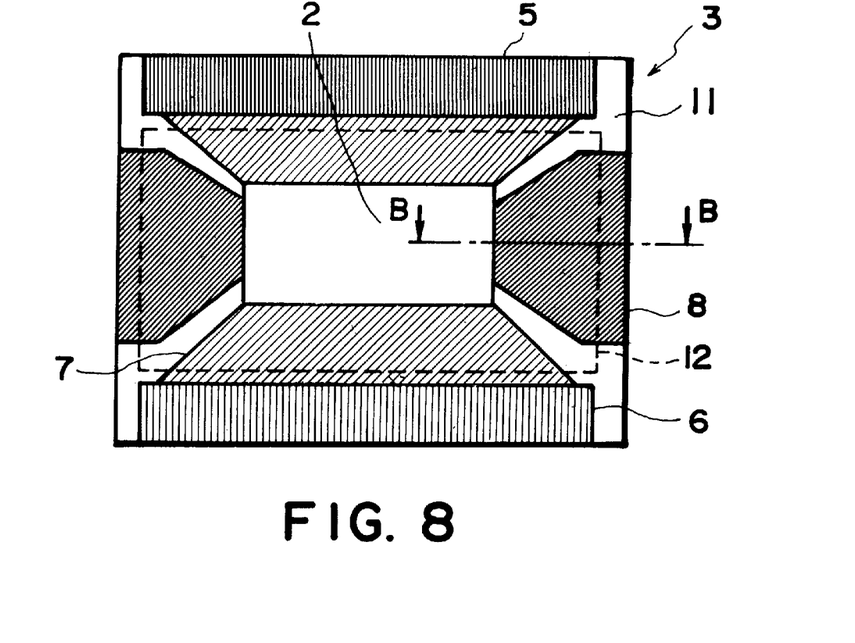
FIG. 8 is a bottom plan view of still another embodiment of the TCP structure according to the invention.
Figure 9:
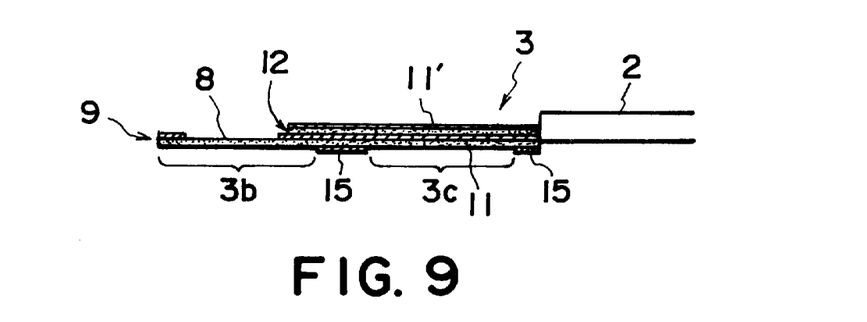
FIG. 9 is a sectional view taken along line B'—B' in FIG. 8.

FIG. 8 is a bottom plan view (as viewed after removing the backside protective insulating film 15) of such a third embodiment of TCP and FIG. 9 is a sectional view taken along line B—B as viewed (after overturning) in the direction of the arrows.

Referring to FIGS. 8 and 9, on a film 11, lead electrodes 7 for supplying an electric power and signals and second conductor patterns 8 at a blank region free from the lead electrodes 7 similarly as in the embodiment of FIG. 3 are provided. The TCP is further provided with an additional conductor layer 12 for heat dissipation (also functioning as a second conductor pattern) disposed in lamination with the second conductor pattern 8 and the lead electrodes 7 via the flexible film 11. The conductor pattern 12 may also be island-shaped and may be coated with an insulating protective film 11. The TCP 3 is connected to a bus substrate (4 as shown in FIG. 5) via the input lead electrodes 6 and the second conductor pattern 8 at a region 3b or 3c exposed through the insulating layer 15.

The conductor layer (or third conductor pattern) 12 for heat dissipation is designed to contact the driver IC 2 so as to provide the TCP 3 with an enhanced heat dissipation ability. More specifically, heat evolved from the driver IC 2 can be conducted to the third conductor pattern 12 and dissipated therefrom, thus promoting the heat dissipation from the driver IC 2.

Further, by electrically connecting the second conductor pattern 8 and the third conductor pattern 12 to a ground line for the driver IC or a power supply line of low impedance, the potentials of the conductor patterns may be fixed to alleviate ill effects, such as the occurrence of noise.

Figure 10:
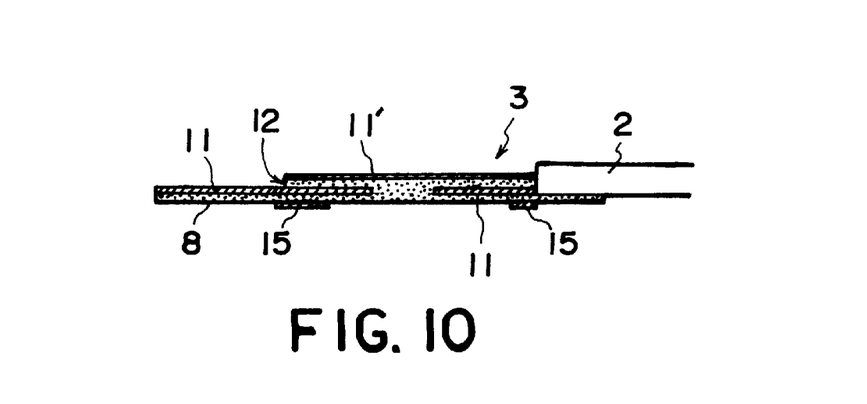
FIG. 10 is a sectional view showing a modification of the structure shown in FIG. 9.

FIG. 10 is a sectional view showing a modification of the TCP structure shown in FIGS. 8 and 9 (particularly FIG. 9), wherein the conductor pattern 8 and the conductor pattern 12 formed on and in lamination with the film 11 and the insulating layer 11' are designed to contact each other by partial removal of the film 11 and further contact the driver IC 2. As a result, heat evolved from the driver IC may be dissipated further effectively through the conductor patterns 8 and 12.

The connection of the conductor patterns 8 and 12 to the power supply line and the ground line of low impedance is also effective for alleviating difficulties, such as the occurrence of noise. In this case, in the embodiment of FIG. 10 wherein the conductor patterns 8 and 12 are connected to each other, the conductor pattern 12 is prevented from floating, so that the potential is further stabilized.

The TCP structure described above with respect to some embodiments thereof may be incorporated in a display apparatus as described hereinbelow.

Figure 11:
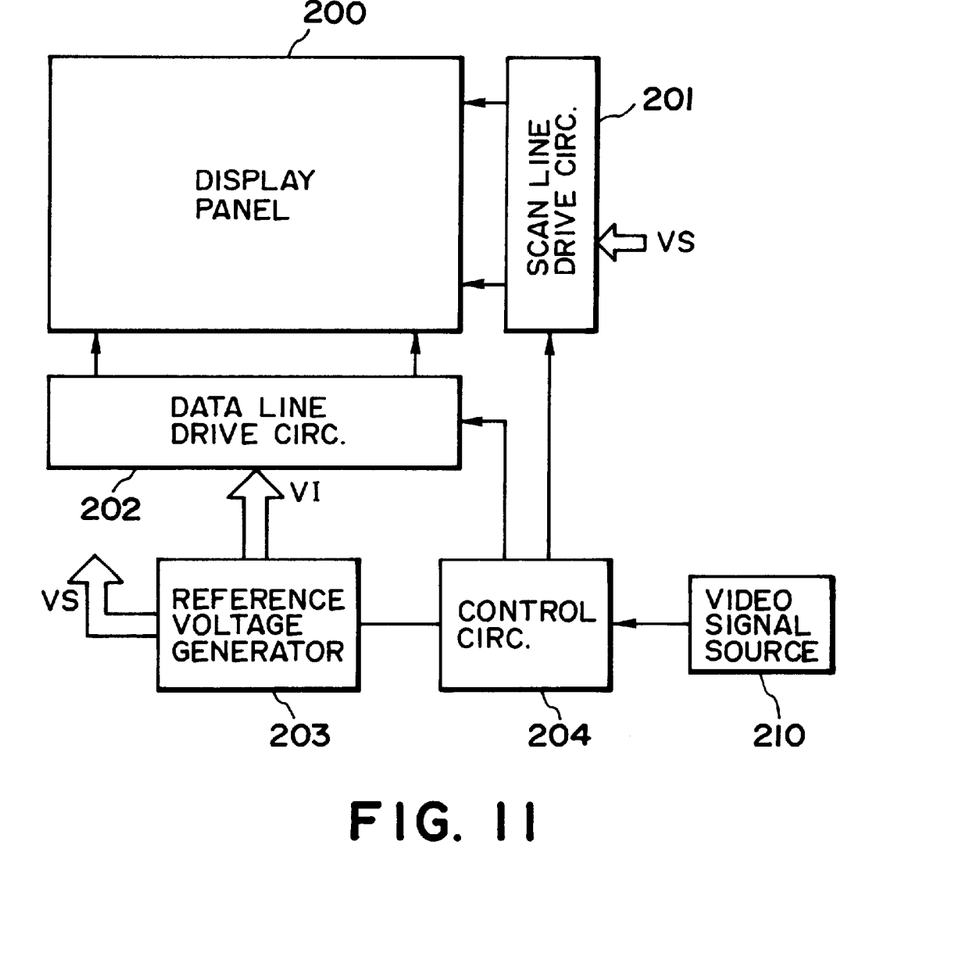
FIG. 11 is a block diagram of a display apparatus control system.

FIG. 11 is a block diagram of an example of such a display apparatus (liquid crystal display apparatus). Referring to FIG. 11, the display apparatus includes a display panel (liquid crystal panel) 200 which is combined with polarizers and may be provided with a backlight as desired. The display apparatus further includes a scanning line driver circuit 201 including a decoder and switches, a data line driver circuit 202 including a latch circuit, a shift register and switches, a reference voltage generator circuit 203 for supplying reference voltages to the driver circuits 201 and 202, a control circuit 204 including a CPU and RAM for holding picture data, and a video signal supply 210, such as an image sensor for picture data input or a computer for operating an application program.

The TCP structure of the present invention as described above may be applied as a structure for connecting the scanning line driver circuit 201 and the data line driver circuit 202 to the display panel 200.

As described above, in the TCP structure according to the first aspect of the present invention, in addition to a first conductor pattern functioning as lead electrodes for supplying an electric power and signals to a semiconductor device such as a driver IC, mounted thereon, a second conductor pattern free from charge of signal supply to or from the semiconductor device is formed and connected to another substrate, preferably one on which the TCP is mounted, thereby utilizing the substrate as a kind of heat slinger to realize effective heat dissipation. Further, by disposing the second conductor pattern in two layers, a further enhanced heat dissipation may be accomplished to suppress a temperature increase of the TCP and the semiconductor device.

The TCP structure according to the second aspect of the present invention includes a flexible film, a semiconductor device mounted on the film and a first conductor pattern formed on the film and connected to the semiconductor device for signal supply from and/or to the semiconductor device, wherein at least a portion of at least one surface of the tape carrier package has been subjected to blackening.

Spatial heat dissipation from an object greatly depends on the shape, particularly the surface area, of the object, and the temperature of a fluid surrounding the object. However, in an ordinary TCP structure carrying a semiconductor device (integrated circuit), the carrier film per se of the TCP is very thin, so that surface area increase thereof is structurally difficult, and a further means for promoting the heat dissipation from the semiconductor device and the TCP is desired.

According to the second aspect of the present invention in view of the above-described factors, a TCP structure is subjected to a blackening with respect to at least a portion of the surface thereof. Herein, "blackening" is surface treatment for enhancing heat radiation from a TCP. A radiation energy E emitted per unit time from a unit surface of a body may be represented by the following Stefan Boltzmann law:

$$E = \epsilon \cdot \sigma \cdot T^4$$

wherein denotes a surface emission factor of an object surface (1.0 for a perfect black body), $\sigma$ denotes the Stefan-Boltzmann constant and T denotes the absolute temperature (° K) of the object. The heat radiation of an object surface may be represented by the surface emission factor $\epsilon$. In the present invention, the TCP surface may preferably be treated by blackening to provide a surface emission factor $\epsilon > 0.95$ as measured at room temperature compared with $\epsilon =$ ca. 0.6 or below of an ordinary IC or $\epsilon =$ ca. 0.8 or below of an ordinary carrier film of, e.g., polyimide. The blackening of a TCP surface may be performed by application of a black-colored paint or black colored film. The paint or film may preferably comprise a weather-resistant resin, such as silicone resin and may be colored by dispersion of, e.g., non-conductive carbon black. The effect of blackening for promoting heat radiation may be enhanced by the TCP with a non-glare surface as by application of a black-colored matte coating paint or film.

The blackening may preferably be applied to the entire area of at least one surface of the flexible film of the TCP. It is also preferred that the exposed portion of the semiconductor device is subjected to the blackening.

The TCP structure may be mounted on a substrate (or a circuit board) for supplying electric power and signals to the semiconductor device or another substrate (e.g., a display panel) for receiving signals from the semiconductor device to form a circuit connection structure. During the operation of the semiconductor device, heat is evolved from the semiconductor device and/or the conductor pattern, and the heat may be effectively liberated from the blackened region to a space adjacent thereto.

The TCP structure may be particularly suitably applied to mounting of driver ICs for a display apparatus. More particularly, the semiconductor device in the TCP structure may be used as a driver IC, the output electrodes of the semiconductor device may be connected to electrode terminals on a substrate of a display panel via a first conductor pattern, and the input electrodes of the semiconductor device may be connected via another first conductor pattern to a circuit board for supplying electric power and signals to the display panel via the semiconductor device. Thus, the conduction of heat evolved from the driver IC and the first conductor pattern through which an electric power and signals are actually transmitted to the display panel side is minimized, and the heat liberation is promoted from the structure surface, particularly the surface of the film. As a result good picture display may be achieved even when a high-speed drive of a display panel has a temperature-dependence of display characteristic, while minimizing a temperature distribution over the display panel.

It is particularly preferred to apply the blackening to a TCP structure having on its flexible film a second conductor pattern substantially free from charge of signal supply to or from the semiconductor device in addition to the first conductor pattern in charge of signal supply to and/or from the semiconductor device, so as to most effectively enhance heat dissipation from the taper carrier package.

Hereinbelow, a more detailed description of the second aspect of the present invention will be made based on a specific embodiment while referring to the drawings.

The TCP structure according to the second aspect of the present invention may have a structure which is basically identical to the one described with reference to FIGS. 1 and 2 and at least the surface side of the TCP 3 or the film 11 thereof has been subjected to blackening as by application of a black-colored matte coating or paint.

Figure 12:
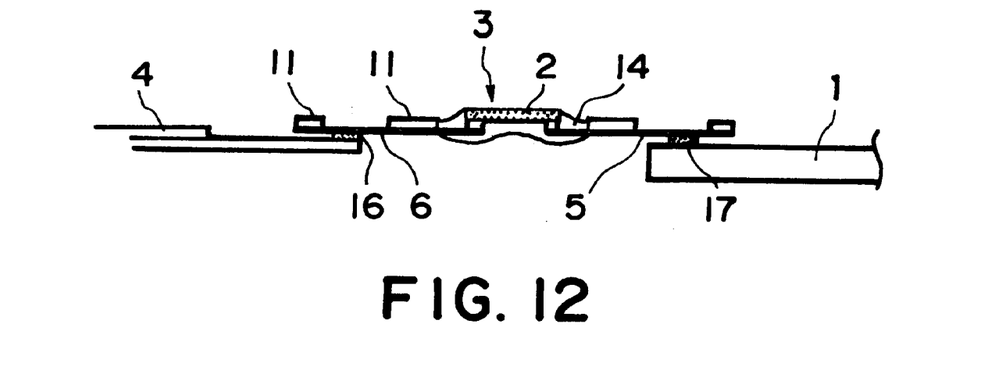
FIG. 12 is a sectional view taken along line C—C in FIG. 1.

FIG. 12 is a sectional view taken along line C—C in FIG. 1. Referring to FIG. 12, the TCP 3 incudes input lead electrodes 6 connected to electrode terminals of a circuit board 4 with a solder 16, and output lead electrodes 5 connected to electrode terminals of a liquid crystal display panel 1 with, e.g., an anisotropic conductive adhesive (ACF) 17. At least the front (or upper) surface side of the film 11 has been subjected to blackening as described above. It is further preferred that the exposed surface of the driver IC 2 is also subjected to blackening, and a sealing region 14 where the driver IC 2 and the lead electrodes are connected to each other and sealed is also subjected to surface-blackening. The back side of the TCP 3 except for the input lead electrodes 6 and the output lead electrodes may preferably be coated with an insulating film.

In a specific example, there were provided a pair of TCP structure each having a planar structure as shown in FIG. 2 and comprising a polyimide carrier film (of 170 mm×260 mm, a surface emission factor ε=ca. 0.8 or below at room temperature) and input and output lead patterns of tin-plated copper formed thereon, and further a driver IC 2 of 8 mm×5 mm, ε=ca. 0.6 or below at room temperature) mounted thereon. One surface of one TCP structure including the film portion and the driver IC was entirely spray-coated with a black-colored silicone resin-based matte coating paint (black matte paint available from Asahi Pen K.K.) to form a coated surface exhibiting ε=ca. 0.98 at room temperature.

The coated TCP and the remaining non-treated TCP were respectively subjected to measurement of heat resistances in the following manner.

First of all, the I–V characteristic of a diode in each IC was checked at various temperatures so as to determine the temperature of the IC during the heat resistance measurement based on the I–V characteristic of the diode at a constant current of 1 mA.

Then, each TCP sample was placed in an environment of room temperature (25° C.) and substantially no air flow and supplied with power supply signals to cause heat generation based on-state resistances of all output transistors in the IC at several power consumption levels (W) to measure the result and temperatures of the IC chip, thereby determining heat resistance Rth based on the following equation:

Heat resistance $Rth = \Delta T/P$, wherein $\Delta T$ represents a temperature increase (=measured IC chip temperature −25° C.) and P represents a power consumption (W).

Figure 13:
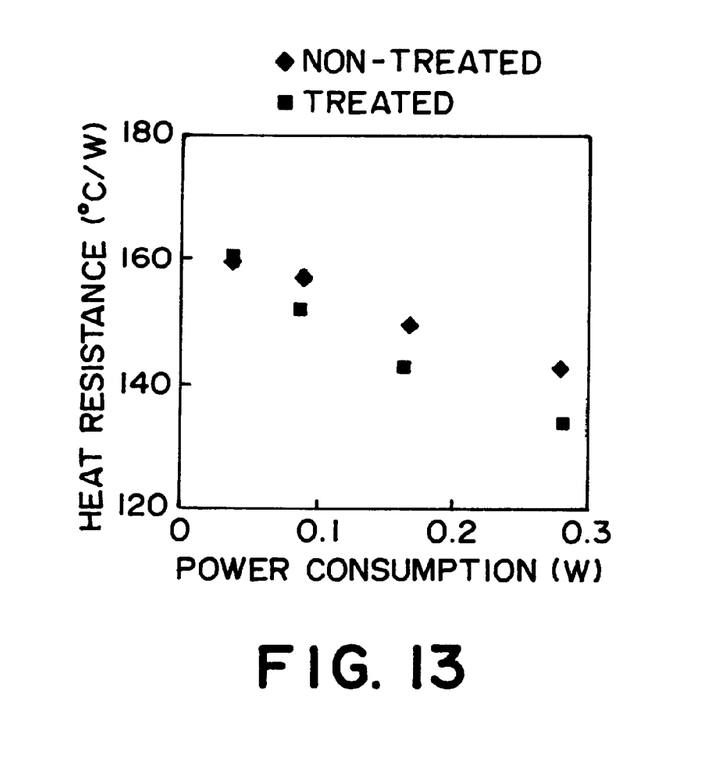
FIG. 13 is a graph showing relationships between power consumption and heat resistance including one obtained when an embodiment of the TCP structure according to the invention is used.

The measured results for the treated (i.e., coated) TCP sample and the non-coated TCP sample are summarized in FIG. 13. As is understood from FIG. 13, the TCP sample treated by coating with a black-colored paint to provide an elevated surface emission factor exhibit a remarkably lower temperature increase per unit power consumption, thus exhibiting improved heat dissipation performance at an increased power consumption from the driver IC.

By blackening the TCP 3 as described above, it is possible to improve the heat radiation efficiency from the surface of the TCP 3, thus enhancing the heat dissipation efficiency of the TCP 3.

Further, if the bus substrate (circuit board) 4 on which the TCP 3 has been mounted is also subjected to the blackening, it is also possible to improve the radiation into space of the heat conducted to the bus substrate 4 from the TCP 3, thus improving the overall heat dissipation efficiency from the TCP 3.

Further, a similar effect may be attained by first mounting the TCP 3 on the bus substrate 4 and subjecting the surface of the TCP 3 including the exposed surface of the TCP 3 and a portion or entirety of the surface of the bus substrate 4 to the blackening.

The blackening may also be applicable to the TCP 3 after provision of the conductor pattern 8 and/or the conductor pattern 12, so as to further improve the heat dissipation efficiency.

As described above, according to the second aspect of the present invention, by subjecting the surface of the tape carrier package to blackening, the spatial heat dissipation from the TCP can be improved to suppress a temperature increase of an associated integrated circuit.

When the semiconductor device (integrated circuit) mounted on the tape carrier package is subjected to the surface blackening, the spatial heat dissipation efficiency is further improved.

Further, if a substrate on which the TCP is mounted is also subjected to blackening, the spatial heat dissipation efficiency if further enhanced.

The blackening may be applicable as a post-treatment after ordinary mounting of a TCP and may be applied to the TCP surface, the integrated circuit surface and the mounting substrate surface.

What is claimed is:

1. A tape carrier package structure comprising:
    a flexible film,
    a semiconductor device mounted on the film,
    a first conductor pattern formed on the film and connected to the semiconductor device for inputting signals to, outputting signals from, or both inputting signals to and outputting signals from the semiconductor device, and
    a second conductor pattern formed in a region not provided with the first conductor pattern on the film in a state substantially free from signal supply to or from the semiconductor device,
    wherein the second conductor pattern is formed in a planar island shape.

2. A structure according to claim 1, wherein the second conductor pattern is disposed in a pair outside a pair of opposite sides of the semiconductor device.

3. A structure according to claim 1, wherein the second conductor pattern is thermally connected to the semiconductor device.

4. A tape carrier package structure comprising:
    a flexible film,
    a semiconductor device mounted on the film,
    a first conductor pattern formed on the film and connected to the semiconductor device for inputting signals to, outputting signals from, or both inputting signals to and outputting signals from the semiconductor device,
    a second conductor pattern formed in a region not provided with the first conductor pattern on the film in a state substantially free from signal supply to or from the semiconductor device,
    wherein the second conductor pattern is formed in a planar island shape, and
    a third conductor pattern provided on the second conductor pattern with an insulating layer sandwiched between the second and third conductor patterns.

5. A structure according to claim 4, wherein said second and third conductor patterns are electrically connected to each other.

6. A tape carrier package structure having two major surfaces comprising:
    a flexible film,
    a semiconductor device mounted on the film,
    a first conductor pattern formed on the film and connected to the semiconductor device for inputting signals to, outputting signals from, or both inputting signals to and outputting signals from the semiconductor device,
    a second conductor pattern formed in a region not provided with the first conductor pattern on the film in a state substantially free from signal supply to or from the semiconductor device,
    wherein at least a portion of at least one of the two major surfaces is blackened by application of a black-colored coating to provide a surface emission factor larger than 0.95.

7. A structure according to claim 6, wherein the entire surface of the flexible film on said at least one of the two major surfaces is blackened.

8. A structure according to claim 7, wherein the surface of the semiconductor device is blackened in addition to the flexible film.

9. A circuit connection structure comprising:

a circuit board, and a tape carrier package structure, wherein
  (A) the tape carrier package structure comprises:
    a flexible film,
    a semiconductor device mounted on the film,
    a first conductor pattern formed on the film and connected to the semiconductor device for inputting signals to, outputting signals from, or both inputting signals to and outputting signals from the semiconductor device, and
    a second conductor pattern formed in a region not provided with the first conductor pattern on the film in a state substantially free from signal supply to or from the semiconductor device,
    wherein the second conductor pattern is formed in a planar island shape and
  (B) the tape carrier package structure is mounted on the circuit board via the first conduct or pattern.

10. A structure according to claim 9, wherein the second conductor pattern is disposed in a pair outside a pair of opposite sides of the semiconductor device.

11. A structure according to claim 9, further including a third conductor pattern provided on the second conductor pattern with an insulating layer sandwiched between the second and third conductor patterns.

12. A structure according to claim 11, wherein said second and third conductor patterns are electrically connected to each other.

13. A circuit connection structure comprising:

a circuit board, and a tape carrier package structure, wherein
  (A) the tape carrier package structure comprises:
    a flexible film,
    a semiconductor device mounted on the film,
    a first conductor pattern formed on the film and connected to the semiconductor device for inputting signals to, outputting signals from, or both inputting signals to and outputting signals from the semiconductor device, and
    a second conductor pattern formed in a region not provided with the first conductor pattern on the film in a state substantially free from signal supply to or from the semiconductor device,
    wherein the second conductor pattern is formed in a planar island shape and
    wherein the second conductor pattern is physically connected to the semiconductor device and
  (B) the tape carrier package structure is mounted on the circuit board via the first conductor pattern.

14. A circuit connection structure comprising:

a circuit board, and a tape carrier package structure, wherein
  (A) the tape carrier package structure has two major surfaces and comprises:
    a flexible film,
    a semiconductor device mounted on the film,
    a first conductor pattern formed on the film and connected to the semiconductor device for inputting signals to, outputting signals from, or both inputting signals to and outputting signals from the semiconductor device,
    a second conductor pattern formed in a region not provided with the first conductor pattern on the film in a state substantially free from signal supply to or from the semiconductor device,
    wherein at least a portion of at least one of the two major surfaces is blackened by application of a black-colored coating to provide a surface emission factor larger than 0.95, and
  (B) the tape carrier package structure is mounted on the circuit board via the first conductor pattern.

15. A structure according to claim 14, wherein the entire surface of the flexible film on said at least one of the two major surfaces of the tape carrier package structure is blackened.

16. A structure according to claim 15, wherein the surface of the semiconductor device is blackened in addition to the flexible film.

* * * * *

UNITED STATES PATENT AND TRADEMARK OFFICE
CERTIFICATE OF CORRECTION

PATENT NO. : 6,184,965 B1
DATED : February 6, 2001
INVENTOR(S) : Kazuhiko Murayama et al.

It is certified that error appears in the above-identified patent and that said Letters Patent is hereby corrected as shown below:

Column 1,
Line 34, "drive" should read -- driver --.

Column 4,
Line 65, "lower" should read -- power --.

Column 5,
Line 53, "an" should be deleted.

Column 7,
Line 56, "wherein" should read -- wherein $\epsilon$ --;
Line 67, "black colored" should read -- black colored --.

Column 8,
Line 31, "an" should be deleted.

Column 9,
Line 1, "electrodes may" should read -- electrodes 5 may --;
Line 3, "structure" should read -- structures --;
Line 7, "IC 2 of" should read -- IC 2 (of --;
Line 25, "on-state" should read -- on state --;
Line 38, "exhibit" should read -- exhibits --.

Column 10,
Line 5, "if" should read -- is --

Column 11,
Line 23, "shape" should read -- shape, --;
Line 25, "conduct or" should read -- conductor --.

UNITED STATES PATENT AND TRADEMARK OFFICE
CERTIFICATE OF CORRECTION

PATENT NO. : 6,184,965 B1
DATED : February 6, 2001
INVENTOR(S) : Kazuhiko Murayama et al.

It is certified that error appears in the above-identified patent and that said Letters Patent is hereby corrected as shown below:

<u>Column 12,</u>
Line 10, "device" should read -- device, --.

Signed and Sealed this

Thirteenth Day of November, 2001

Attest:

NICHOLAS P. GODICI
*Attesting Officer*    *Acting Director of the United States Patent and Trademark Office*